United States Patent [19]

Sawada et al.

[11] 4,433,043

[45] Feb. 21, 1984

[54] WATER BASED PHOTOSENSITIVE COMPOSITION WITH HYDROLYZATE OF MAMMAL COLLAGEN

[75] Inventors: Yoshikatu Sawada, Tokyo; Kazuo Shirakawa, Ichikawa; Takeo Sugiura, Tokorozawa, all of Japan

[73] Assignees: Toppan Printing Co., Ltd.; Nippi, Inc., both of Tokyo, Japan

[21] Appl. No.: 321,048

[22] Filed: Nov. 13, 1981

[30] Foreign Application Priority Data

Nov. 18, 1980 [JP] Japan ................................ 55-162141

[51] Int. Cl.$^3$ ........................... G03C 1/60; G03C 1/71
[52] U.S. Cl. ..................................... 430/175; 430/176; 430/270; 430/289; 430/627; 430/628; 430/640; 430/642; 430/325
[58] Field of Search ............... 430/175, 176, 270, 289, 430/642, 640, 628, 627

[56]  References Cited

U.S. PATENT DOCUMENTS 2,522,771  9/1950  Barnes et al. ...................... 430/627
2,824,000  2/1958  Eckardt ............................. 430/289
2,937,085  5/1960  Seven et al. ....................... 430/176
3,748,142  7/1973  Battista ............................. 430/642
4,145,455  3/1979  Fujimaki et al. ................... 430/642
4,360,590 11/1982  Tomka .............................. 430/642

OTHER PUBLICATIONS

Kosar, J., "Light-Sensitive Systems", J. Wiley & Sons, 1965, pp. 55-58.

Primary Examiner—Charles L. Bowers, Jr.
Attorney, Agent, or Firm—Bacon & Thomas

[57]  ABSTRACT

A water based photosensitive composition comprises a hydrolyzate of a mammal collagen and a photosensitizer serving to cross-link the hydrolyzate when exposed to an active light. The hydrolyzate has a number-average molecular weight, $\overline{M}n$, of 2,000 to 30,000 and an intrinsic viscosity, $[\eta]$, of 0.060 to 0.155 dl/g in a 0.15 mole citric acid buffer solution maintained at 40°C. Also, the hydrolyzate is capable of maintaining the formability of the collagen fold. A photoresist pattern formed by using the composition exhibits a high resolution, a good dyeing property and a strong corrosion resistance.

9 Claims, 3 Drawing Figures

WATER BASED PHOTOSENSITIVE COMPOSITION WITH HYDROLYZATE OF MAMMAL COLLAGEN

BACKGROUND OF THE INVENTION

This invention relates to a water based photosensitive composition containing a water-soluble polymer and photosensitizer.

In the conventional making of a name plate or precision part, a resist pattern is formed on a support member by a photosensitive composition which, when exposed to an active light, indicates different degrees of solubility in a solvent between the portion exposed to the active light and the portion not exposed to the active light. Depending on the object intended, the photosensitive composition is demanded to have such property as can provide a strong anticorrosive photo resist or a satisfactorily colored photo resist. In either case, a water based photosensitive composition is preferred which excels in promoting labor hygienics and reducing cost.

Macro molecular substance (polymer) hitherto used in the production of the above-mentioned water based photosensitive composition include natural macro molecular substance such as gelatin, casein, fish glue, and egg albumin and synthetic water-soluble macro molecular substance such as polyvinyl alcohol, polyvinyl pyrrolidone, and polyacryl amide. The photosensitivity and image-resolving property of a photosensitive composition particularly prepared from a mixture of a macro molecular substance and photosensitizer largely depend as a rule on the average molecular weight of a macro molecular substance contained in the photosensitive composition. To ensure a desired photosensitive property, therefore, it is necessary to accurately control the average molecular weight of a macro molecular substance used. The molecular weight of a refined natural macro molecular substance depends to a large extent on the molecular weight of the raw material and on the refining process. Since the raw material consists of molecules widely differing from each other in molecular weight, it is difficult to prepare a refined natural macro molecular substance of a desired average molecular weight. Thus, a photosensitive composition containing a natural macro molecular substance tends to fail to exhibit a satisfactory photosensitivity and image-resolving power. With respect to gelatin in particular which has a low solubility in water and is extremely difficult to handle at ordinary temperature, it is necessary to heat gelatin for its dissolution, application and development. Casein has to be dispersed in water by being dissolved in an alkali solution.

Casein is a globular protein which belongs to a conjugated protein (or phosphoprotein). On the other hand, gelatin is a fibrous protein belonging to a simple protein (or scleroprotein). Both gelatin and casein have a large average molecular weight. This means that gelatin and casein have a high setting point, that is, a low solubility in water, and, when applied as a photosensitive solution, have a high photosensitivity and a high dark reaction rate. Egg albumin is a globular protein belonging to the simple protein, has an average molecular weight which is not appreciably large, a high solubility in water and can be easily handled at ordinary temperature. However, the egg albumin contains a large amount of cystin due to its specific molecular structure and tends to give rise to thermal vulcanization and coagulation, and consequently is found unstable when used as a photosensitive composition. Synthetic water-soluble macro molecular substance can be produced with a prescribed average molecular weight and controlled, for example, in photosensitivity and image-resolving property with greater ease than natural macro molecular substance. However, a resist film utilizing a synthetic water-soluble resin is low in adhesiveness to a substrate and in elasticity. Thus, if the resist film is used as a photo resist, side etching is promoted. Also, the resist film mentioned fails to exhibit a sufficient resistance to corrosion, rendering it necessary to cure the resist film with anhydrous chromic acid. Further the said photo resist has an undesirably low dyeability to a hydrophilic dyestuff. This drawback can be easily inferred from the following fact. Where a water soluble macro molecular substance, synthetic or natural, is dyed, then its dyeing density largely depends on the bonding strength of the ionic bonds between a functional group contained in said macro molecular substance and a dyestuff applied. It is known that the extent of said bonding is defined by a number of functional groups contained in said water-soluble macro molecular substance. Usable hydrophilic dyes include direct, acid and basic dyes. An amino group in the macro molecular substance functions as an adsorption site for direct and acid dyes which contains a sulfonic groups in the molecule. A carboxylic group functions as an adsorption site for basic dyes which contains an amino groups in the molecule. Where comparison is made between a number of amino groups contained in a natural water-soluble macro molecular substance and that contained in a synthetic water-soluble macro molecular substance, the natural water-soluble macro molecular substance contains about 1.0 m eq of amino groups per g of macro molecular substance, while the synthetic water-soluble macro molecular substance contains about 0.1 m eq of amino groups per g of macro molecular substance. As seen from these numerical data, the synthetic water-soluble macro molecular substance can be expected to provide the amount of ionic bonding only accounting for about one-tenth of that observed in the natural water-soluble macro molecular substance.

SUMMARY OF THE INVENTION

It is the object of this invention to provide a novel water based photosensitive composition free of the drawbacks accompanying the conventional water based photosensitive materials.

To attain the above-mentioned object, this invention provides a water based photosensitive composition, which comprises:

a hydrolyzate of a mammal collagen; and a photosensitizer serving to cross-link said hydrolyzate when exposed to an active light, said hyrolyzate having a number-average molecular weight, $\overline{M}n$, of 2,000 to 30,000 and a intrinsic viscosity, $[\eta]$, of 0.060 to 0.155 dl/g as measured in 0.15 mole of citric acid buffer solution at 40° C., and being capable of maintaining the helix-formability of the collagen fold.

The "helix-formability of the collagen fold" used herein denotes that, even if the polypeptide chain forming collagen molecule has been severed by hydrolysis, each of the resultant shorter polypeptide chains is capable of forming a triple-helical structure characteristic of the collagen molecule.

The intrinsic viscosity, [η], of the hydrolyzate as measured in 0.15 mole of citric acid buffer solution at 40° C. is simply referred to as "the intrinsic viscosity of the hydrolyzate".

The above-mentioned natural water based photosensitive composition embodying this invention is deposited in a thin layer on a substrate. After tightly contacted to a photo mask, said water based photosensitive composition layer is exposed to an active light, when developed at the next stage, said photosensitive composition layer can form a resist pattern assuring high resolving degree and high contrast on the substrate. The water based photosensitive composition of the invention has further advantages that the photosensitivity of said photosensitive composition can be controlled by the number-average molecular weight of the peptide resin; the photo resist thus obtained has good dyeability and high corrosion resistance; said photo resist allows for easy development by water and excels in the handling property; and the subject photosensitive composition is minimized in dark reaction, thereby assuring high storage stability.

DETAILED DESCRIPTION OF THE PREFERRED EMBODIMENTS

The mammal collagen used in this invention includes those which are obtained from the bones, or hides (skins) of cattles, pigs and sheep.

Figure 1:
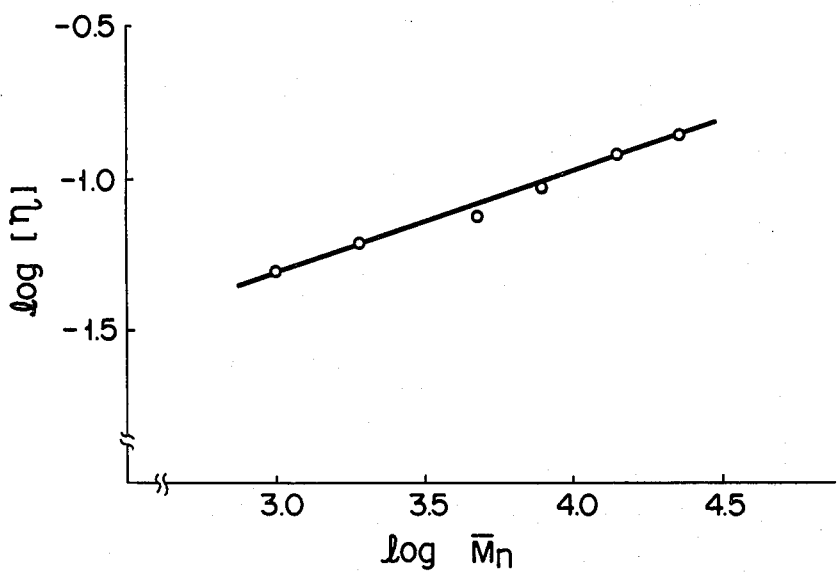
FIG. 1 shows relationship between the number-average molecular weight, $\overline{M}n$, of the peptide resin and the intrinsic viscosity, [η], of the hyrolyzate of the collagen.

The hyrolysis product of the collagen whose molecular chain consists of a peptide bond is generally referred to as "peptide resin". With the method of this invention, the average molecular weight of the peptide resin can be freely controlled by optionally selecting the conditions for the hydrolysis of collagen. Various samples of peptide resin were produced from cattle bones or pig skins, the physical properties of said samples being shown in Table 1 below. The following relationship is deduced from FIG. 1 showing relationship between the number-average molecular weight, $\overline{M}n$, of the peptide resin and the specific viscosity, [η], of the hydrolyzate of the collagen $$[\eta] = 4.90 \times 10^{-3} \overline{M}n^{0.333}$$

The items of the experiments listed in Table 1 above were determined in the following manner.
1. Item of experiment: number-average molecular weight $\overline{M}n$
   Determined by Van Slyke method
2. Item of experiment: Intrinsic viscosity, [η],
   Solutions (40° C.) of various peptide resin samples were prepared with 0.15 mole citric acid buffer solution of pH 3.7 (a mixture of sodium citrate and citric acid). The intrinsic viscosity of the peptide resin solutions was determined from the following equation:

$$[\eta] = \lim_{C \to 0} \frac{\eta - \eta_0}{\eta_0} / C$$

where:
 $\eta$ = viscosity of peptide resin solution
 $\eta_0$ = viscosity of citric acid buffer solution
 C = concentration (g/dl) of peptide resin solution
3. Item of experiment: Setting point
   Determination was made of the setting point of the 10% by weight solution of the respective peptide resin samples.
4. Item of experiment: Relative light sensitivity
   The relative light sensitivity of the peptide resin samples was expressed by an index of a light quantum indicating the photo cross-linking characteristic of a photosensitive solution prepared from a mixture of ammonium bichromate and peptide resin in the weight ratio of 1:1. The photosensitivity of said peptide resin samples expressed by a smaller index was taken to be higher.

The mammal collagen was hydrolyzed by letting an acid, an alkali and an enzyme act on said collagen by properly controlling the temperature, reaction time and pressure used in the hydrolysis. In this case, severe hydrolysis conditions provide a peptide resin having a smaller average molecular weight, while gentle hydrolysis conditions produce a peptide resin having a larger average molecular weight. For reference, description is now given of the case where the mammal collagen was hydrolyzed by hydrochloric acid. Where the hydrolysis was carried out under the conditions set forth in Table 2 below, the rate of hydrolysis was controlled by an added amount of hydrochloric acid.

Table 2

Figure 2:
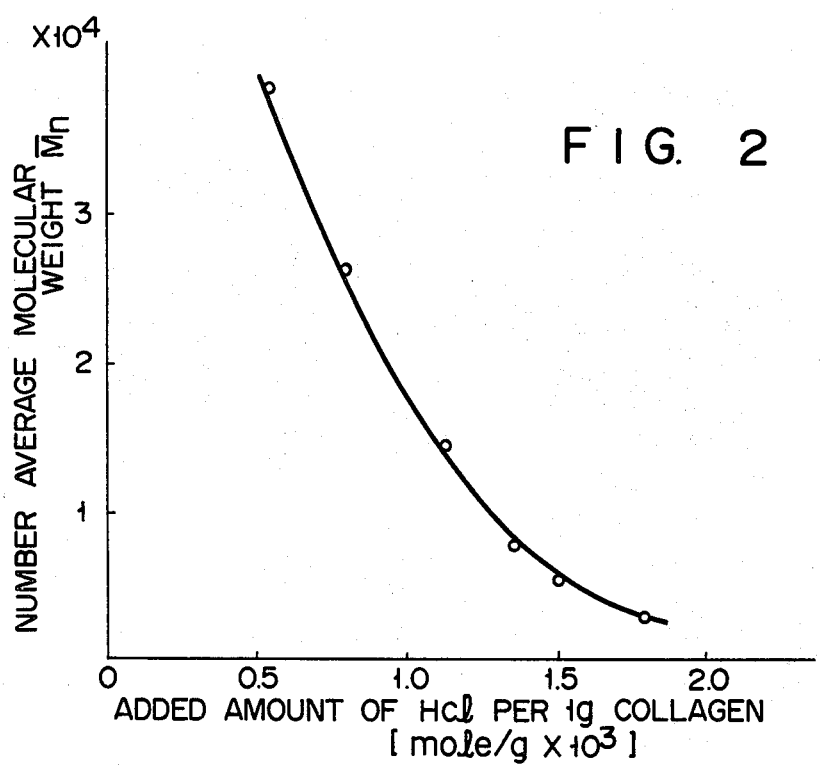
FIG. 2 indicates relationship between the concentration of hydrochloric acid used in the hydrolysis of collagen and the number-average molecular weight, $\overline{M}n$, of the peptide resin produced.

Temperature (°C.): 80 to 120
Collagen concentration (wt%): 10 to 40
Time (hr): 1 to 4
Pressure (kg/cm²): atmospheric to 2
FIG. 2 indicates the rate of hydrolysis carried out under the conditions:
Temperature (°C): 80

TABLE 1

| Sample | Control A | 1 | 2 | 3 | 4 | 5 | 6 | Control B | Control C |
|---|---|---|---|---|---|---|---|---|---|
| Raw material | Cattle bone | Cattle bone | Cattle bone | Cattle bone | Cattle bone | Cattle bone | Pig skin | Cattle bone | Cattle bone (gelatin) |
| 1. Number-average molecular weight $\overline{M}n$ | 1,010 | 2,020 | 4,750 | 7,830 | 14,080 | 26,500 | 8,520 | 35,200 | about 100,000 |
| 2. Intrinsic viscosity [η] (dl/g) | 0.050 | 0.060 | 0.078 | 0.090 | 0.123 | 0.146 | 0.102 | 0.160 | 0.75 |
| 3. Setting point (°C.) | less than 5 | less than 5 | less than 5 | less than 5 | 9.8 | 16.2 | less than 5 | 20.2 | 26.5 |
| 4. Relative light sensitivity | 600 | 300 | 150 | 100 | 37 | 12 | 100 | 3 | 1 |

Collagen concentration (wt%): 20
Time (hr): 3

A photosensitizer carrying out a photochemical cross-linking reaction with a peptide resin upon exposure to an active light includes bichromates such as ammonium bichromate, sodium bichromate, and potassium bichromate; and diazonium salts such as p-diazophenyl amine, 1-diazo-4-dimethylaminobenzene-hydrofluoborate, 1-diazo-3-methyl-4-dimethylaniline-sulfate, 1-diazo-3-monoethylnaphtylamine and/or paraformaldehyde condensates thereof. However, the photosensitizer is not be limited to the compounds listed above. Namely, any other water soluble photosensitizer well serves the purpose, provided it can form a coordinate bond with a group of the peptide resin which has a lone pair of electrons such as —COOH, —NH$_2$, —OH, —CONH$_2$ and =CO.

Figure 3:
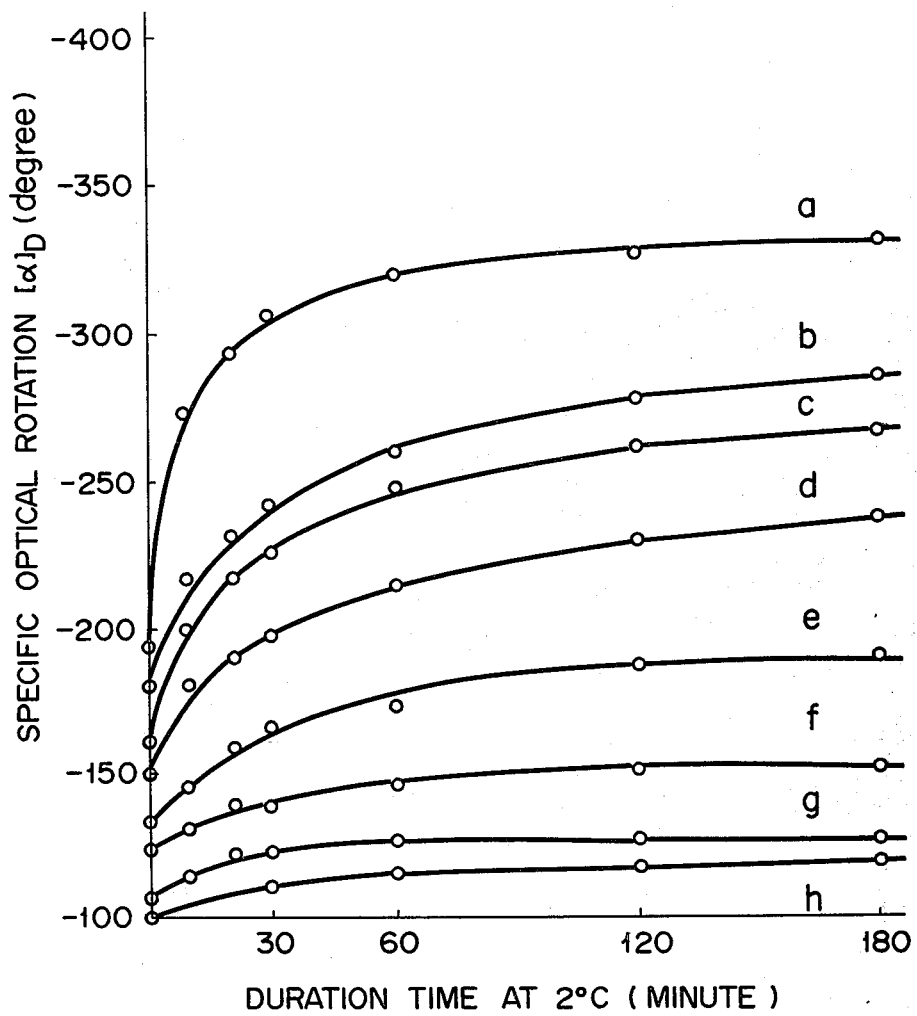
FIG. 3 sets forth changes with time in the optical rotation property of the peptide resin.

Among the amino acids constituting a collagen molecule, the content of imino acid groups, i.e., proline and hydroxy proline, is deeply related with the temperature at which a collagen molecule is denatured. An increase in the content of a pyrolidine ring of the imino acids in collagen molecule leads to the increase in thermal stability of the collagen molecule helix, and consequently to a rise in the collagen-denaturation temperature. Therefore, an animal whose collagen has a higher denaturation temperature is known to be more adapted to live in a warmer environment. This means that the collagen of the animals living in a warm enviroment contains a larger amount of imino acids, thereby elevating the thermal stability of the collagen molecule helix and assuring a greater collagen-fold forming ability. Conversely, with fishes living in a cold environment, for example, a cold current, such as cods and halibuts, the imino acid content in the collagen of these fishes decreases, leading to a decline in the thermal stability of the collagen molecular helix and consequently in the collagen-fold forming ability. It can be easily inferred that an animal living in a zone intermediate between the warm and cold zones can preserve an intermediate physiological characteristic.

Where the peptide bond is broken by the hydrolysis of the collagen of the above-mentioned animals to decrease the average molecular weight of the peptide resin, then a decline results in the thermal stability of the collagen molecular helix, and consequently a fall in the setting point of the hydrolyzate of the mammal collagen and a rise in the water solubility thereof. As seen from FIG. 3 below showing a comparison between the optical rotation of the samples of the peptide resins (whose description is given in Table 3 below) obtained by the hydrolysis of the mammal collagen, the peptide resin still preserves a high collagen-fold forming ability as indicated by curve f, though the main chain of said peptide resin has been served by hydrolysis even to the extent indicated in Table 3. As compared with a fish glue obtained from the collagen of the skin of a cod living in a cold current (indicated by curve h and having a number average molecular weight, $\overline{M}n$, of 42,000 and intrinsic viscosity, [$\eta$], of 0.253), the peptide resin obtained by the hydrolysis of the mammal collagen exhibits to have a higher collagen-fold forming ability.

TABLE 3

| Curve | Samples number in Table 1 | Origin of collagen | Number-average molecular weight (Mn) | Intrinsic viscosity [$\eta$] of the peptide resin (dl/g) |
|---|---|---|---|---|
| a | Control C | Cattle bone (gelatin) | About 100,000 | 0.75 |
| b | 5 | Cattle bone | 26,500 | 0.146 |
| c | 4 | Cattle bone | 14,080 | 0.123 |
| d | 3 | Cattle bone | 7,830 | 0.090 |
| e | 2 | Cattle bone | 4,750 | 0.078 |
| f | 1 | Cattle bone | 2,020 | 0.060 |
| g | Control A | Cattle bone | 1,010 | 0.050 |
| h | — | Cod skin | 42,000 | 0.253 |

As used herein, the term "optical rotation characteristic" of the peptide resin is defined to mean the amount of the helical collagen fold structure of the peptide resin formed when a solution of a peptide resin whose concentration is adjusted to about 1% by weight with a citric acid buffer liquid solution of pH 6.8 (prepared from a mixture of sodium citrate and citric acid) is suddenly cooled from an atmosphere of b 40° C. to that of 2° C. The optical rotation characteristic of the peptide resin is determined by the Rudolph-type polarimeter. The readings on said polarimeter obtained after 10, 20, 30, 60, 120 and 180 minutes after the start were used in determining the specific optical rotation characteristic [$\alpha$]$_D$ of the peptide resin from the following equation.

$$[\alpha]_D = \left(\frac{1,000}{C} \cdot \frac{X}{l}\right) \text{ (degree)}$$

where:
C=concentration (% by weight) of peptide resin solution
l=20 cm (optical path)
X=rotation angle (degree)
D line used wave length $\lambda$=589 nm As the collagen-fold forming ability of the peptide resin progressively rises the absolute value of the optical rotation degree increases.

The photochemical cross-linking property of a photosensitive agent depends on the average molecular weight of a macro molecular substance contained in said photosensitizer. Namely, as is well known, the photosensitivity of the photosensitizer rises, as its average molecular weight increases. However, a natural protein, particularly a macro molecular substance such as collagen which has a peculiar structure, namely, a collagen-fold forming ability indicates a complicated behavior due to its specific structural factors. In other words, where discussion is made of the photosensitive property of a photosensitizer containing a macro molecular substance obtained from the collagen, then it is necessary to pay attention to not only the average molecular weight of said macro molecular substance but also its collagen fold-forming function. The number of molecules of the macro molecular substance per unit volume becomes smaller as the macro molecular substance has a larger average molecules weight where a macro molecular substance is made into an insoluble mixture by reaction with a photosensitizer. Consequently, a smaller number of cross-links is required to make the macro molecular substance into an insoluble mixture, as the macro molecular substance has a larger average molecular weight, thereby elevating the photosensitivity of the macro molecular substance containing the photosensitizer. On the other hand, the resolving power of said macro molecular substance containing the photosensitizer tends to fall, because said macro molecular substance is likely to swell at the time of development due to the presence of a smaller number of cross-links per unit volume. Conversely, where the macro molecular substance has a smaller average molecular weight, then the phenomenon contrary to that described above is observed. Contrary to the above-mentioned theoretical inference, a peptide resin having a high collagen-fold forming ability forms not only molecular cross-links with the photosensitizer but also apparent cross-links resulting from the specific structure of the helix of collagen fold which enables a peptide resin having a smaller averages molecular weight to produce a suitable photosensitivity. Further, because of increase in the crosslinkage density, the peptide, resin permits forming a relief image excellent in a resolving power and the distinctiveness of image lines. In addition, the surface of the relief image is rendered tough. This means that said peptide resin having a smaller average molecular weight itself can be made into a tough corrosion-resistant photo resist layer. Referring to hydrophilic dyes such as direct dyes, acidic dyes and basic dyes, the functional group of a macro molecular substance should be formed of an amino group or carboxylic group. The peptide resin embodying this invention is produced by the hydrodysis of a peptide bond of a mammal collagen. As the hydrolysis proceeds, the amino group and carboxylic group at the end of a molecular chain processively increase in number, enabling the peptide resin to be easily dyed. This means that the peptide resin embodying the present invention surpasses the general natural protein in respect of dyeability. Experiments were further made with the dark reaction of photosensitive solutions prepared by adding ammonium bichromate to the samples of peptide resin (samples Nos. 1 to 5 given in Table 1) in the weight ratio of 1:4 to 1:10. The sample mixtures were heated at 50° C. and allowed to stand in an atmosphere having a relative humidity of 65% for 24 hours. Determination was made of the dark reaction of the above-mentioned samples of the photosensitive solutions of the peptide resin. Said photosensitive solutions did not indicate any rise in the photosensitivity resulting from the dark reaction, proving that the peptide resin photosensitive solution embodying this invention is more useful as a photosensitive composition. The theoretic ground on which this favorable result of the photosensitive solution of the invention is based has not yet been fully understood. In this connection, however, it is assumed that as previously mentioned, the peptide resin assures the secure formation of a collagen fold; the hydrolysis of the peptide bond of the collagen shortens the molecular chain of the collagen, giving rise to a decline in the thermal stability of the collagen-fold forming ability; the thermal cross-linking activation of the peptide resin is promoted, while the thermal stability of the collagen fold of the peptide resin has been permally deteriorated; consequently the peptide resin decreases in apparent cross-linking and indicates a smaller dark reaction, thus assuring a higher storage stability. As inferred from Table 1 mentioned above, a peptide resin hydrolyzed to a number-average molecular weight, $\overline{M}n$, of 30,000 and a lower intrinsic viscosity, $[\eta]$, than 0.155 dl/g has a lower setting point than ordinary temperature. This means said hydrolyzed peptide resin is very soluble in water and can be easily handled.

The water based photosensitive composition embodying this invention is produced by adding 5 to 50% by weight or preferably 10 to 30% by weight of a photosensitizer to the peptide resin. The peptide resin photosensitive composition thus produced is deposited in a thin layer on a substrate of, for example, a glass plate or iron plate by means of whirler coating or dip coating. After tightly contacted to a photo mask, the thin deposited layer of said photosensitive composition is exposed to an active light emitted from, for example, a mercury lamp, ultrapressure mercury lamp, or metal halide lamp. A patterned image produced on the substrate after water development is used as a corrosion resistant layer or colored layer.

This invention will be more fully understood from the examples which follow.

EXAMPLE 1

Hydrochloric acid was added to a cattle bone collagen solution (collagen concentration: 20% by weight) at the rate of $1.52 \times 10^{-3}$ mole per 1 g of the collagen. The mixture was hydrolyzed at 80° C. and ordinary pressure for 3 hours, producing a peptide resin having a number-average molecular weight, $\overline{M}n$, of 4,750 and intrinsic viscosity, $[\eta]$, of 0.078 dl/g. A peptide resin photosensitive composition prepared by mixing 20% by weight of the peptide resin with 2% by weight of a sulfate of a condensate of p-diazo diphenylamine and paraformaldehyde was applied to the surface of a glass substrate with a thickness of 1 to 2 microns. After dried, a photo mask was tightly contacted to the photosensitive composition layer. A light emitted from a 3 kw ultrapressure mercury lamp, disposed 60 cm apart from said photosensitive layer, was projected on said photosensitive layer for about 90 seconds, followed by spraying water onto the photosensitive layer for about 1 minute for the developing purpose, thereby obtaining a relief pattern. Also, another sample, i.e., a glass substrate coated with the peptide resin photosensitive material, was allowed to stand for 24 hours under an atmosphere having a temperature of 50° C. and a humidity of 65%, with no change recognized in photosensitivity after the test.

The resultant relief pattern was dyed for 4 minutes with a 2% solution of Direct Deep Black EX (trade name of a direct dye, C.I. 30,235, produced by Nihon Kayaku K.K.), followed by water-washing and, then, drying the relief pattern so as to obtain a dry plate bearing a dyed pattern exhibiting a light-shielding property equal to that of a lith-type photosensitive material having a transmissive density "D" of 4.0 or more. Also, the dyed pattern exhibited a resolution of 2 to 3 $\mu$ which is fully comparable with that of a high resolution plate of silver salt.

Control 1

An experiment was conducted as in Example 1, except that polyvinyl alcohol was used in place of the peptide resin. The transmissive density "D" of the resultant dyed pattern was less than 1.0. Also, fog was found in the non-image portion, and pin holes were recognized in the dyed pattern, leading to an unsatisfactory dyed pattern. In order to achieve a transmissive density "D" equal to that in Example 1, it was necessary to make the photosensitive layer formed on the glass substrate thicker than 10 $\mu$ and to form an anti-halation layer. In this case, the produced dry plate exhibited a resolution of only about 30 $\mu$.

EXAMPLE 2

Hydrochloric acid was added to a cattle bone collagen solution (collagen concentration: 20% by weight) in an amount of $1.14 \times 10^{-3}$ mole/g of collagen, followed by hydrolyzing the collagen for 3 hours at a temperature of 80° C. and under atmospheric pressure so as to obtain a peptide resin having a number-average molecular weight, $\overline{Mn}$, of 14,080 and an intrinsic viscosity, $[\eta]$, of 0,123 dl/g. An iron plate for a shadow mask defatted by trichloroethylene and alkali was coated by using a whirler in a thickness of 1 to 2 $\mu$ with a peptide resin photosensitive composition containing 20% by weight of the peptide resin and 4% by weight of ammonium bichromate. After the coating was dried, a photo mask was tightly contacted to the coating and the film was exposed to light for about 30 seconds, using a light source similar to that used in Example 1. Then, a developing treatment was performed for about 1 minute by water spray so as to obtain a resist pattern of high resolution; an image line 10 $\mu$ wide was fully resolved. The resultant resist pattern was subjected to a burning treatment for 5 minutes at 250° C., followed by etching the resist pattern for 10 minutes with a 45 Bé ferric chloride solution maintained at 50° C. The holes made by the etching was found rectilinear as desired, and pin holes caused by deterioration of the resist portion were not found at all. For comparison, a similar experiment was conducted by using a casein-based photosensitive solution. Where the photosensitive coating was as thick as above, the resultant resist pattern was low in corrosion resistance. Specifically, the resist portion was corroded by the etchant so as to give rise to innumerable pin holes, failing to perform the role of a resist.

EXAMPLE 3

Hydrochloric acid was added to pig skin collagen solution (collagen concentration: 20% by weight) in an amount of $1.20 \times 10^{-3}$ mole/g of collagen, followed by hydrolyzing the collagen for 3 hours at a temperature of 80° C. and under atmospheric pressure so as to obtain a peptide resin having a number-average molecular weight $\overline{Mn}$ of 8,520 and an intrinsic viscosity of 0.102 dl/g. An iron plate for shadow mask defatted in advance was coated by using a whirler in a thickness of 2 to 5 $\mu$ with a photosensitive material containing 20% by weight of the peptide resin mentioned above and 4% by weight of ammonium bichromate. After the coating was dried, a negative film was tightly attached to the coating and the film was exposed to light for about 1 minute, using a light source similar to that used in Example 1. Then, a developing treatment was performed for about 1 minute by water spray so as to obtain a resist pattern of high resolution; an image line about 10 $\mu$ wide was fully resolved. Further, the resist pattern was etched as in Example 2. The resultant etching holes were found rectilinear as desired.

Control 2

Hydrochloric acid was added to cattle bone collagen solution (collagen concentration: 20% by weight) in an amount of $0.52 \times 10^{-3}$ mole/g collagen, followed by hydrolyzing the collagen for 3 hours at a temperature of 80° C. and under atmospheric pressure so as to obtain a peptide resin having a number-average molecular weight, $\overline{Mn}$, of 35,200 and an intrinsic viscosity, $[\eta]$, of 0.160 dl/g. The produced peptide resin was found to exhibit a setting point of 20.2° C. A photosensitive solution containing the peptide resin was accompanied by such a large viscosity fluctuation with temperature that it was difficult to form a uniform coating layer at room temperature.

What we claim is:

1. A water based photosensitive composition, comprising a water soluble hydrolyzate of a mammal collagen and a photosensitizer serving to cross-link the hydrolyzate when exposed to an active light, said hydrolyzate having a number-average molecular weight, Mn, of 2,000 to 30,000 and an intrinsic viscosity, $[\eta]$, of 0.060 to 0.155 dl/g in a 0.15 mole citric acid buffer solution maintained at 40° C., and being capable of maintaining the formability of the collagen fold.

2. The composition according to claim 1, wherein the hydrolysis is carried out under the action of an acid.

3. The composition according to claim 1, wherein the hydrolysis is carried out under the action of an alkali.

4. The composition according to claim 1, wherein the hydrolysis is carried out under the action of an enzyme.

5. The composition according to claim 1, wherein the mammal collagen is obtained from cattle bone or cattle hide.

6. The composition according to claim 1, wherein the mammal collagen is obtained from pig bone or pig skin.

7. The composition according to claim 1, wherein the mammal collagen is obtained from sheep bone or sheep skin.

8. The composition according to claim 1, wherein the photosensitizer is selected from the group consisting of bichromates, diazonium salts and paraformaldehyde condensates of diazonium salts.

9. The composition according to claim 5, wherein the mammal collagen is cattle bone collagen having a number-average molecular weight of 4,750 and an intrinsic viscosity of 0.078 dl/g.

* * * * *